(12) United States Patent
Huh et al.

(10) Patent No.: US 11,069,964 B2
(45) Date of Patent: Jul. 20, 2021

(54) TRANSPARENT FILM ANTENNA

(71) Applicant: DONGWOO FINE-CHEM CO., LTD., Iksan-si (KR)

(72) Inventors: Yoon Ho Huh, Seoul (KR); Dong Pil Park, Incheon (KR); Yun Seok Oh, Yongin-si (KR)

(73) Assignee: Dongwoo Fine-Chem Co., Ltd., Iksan-si (KR)

( * ) Notice: Subject to any disclaimer, the term of this patent is extended or adjusted under 35 U.S.C. 154(b) by 0 days.

(21) Appl. No.: 16/489,372

(22) PCT Filed: Feb. 21, 2018

(86) PCT No.: PCT/KR2018/002106
§ 371 (c)(1),
(2) Date: Aug. 28, 2019

(87) PCT Pub. No.: WO2018/159955
PCT Pub. Date: Sep. 7, 2018

(65) Prior Publication Data
US 2019/0379113 A1    Dec. 12, 2019

(30) Foreign Application Priority Data
Feb. 28, 2017    (KR) ........................ 10-2017-0025984

(51) Int. Cl.
*H01Q 1/38*    (2006.01)
*H01Q 9/04*    (2006.01)
(Continued)

(52) U.S. Cl.
CPC ............. *H01Q 1/38* (2013.01); *H01L 51/442* (2013.01); *H01Q 1/243* (2013.01); *H01Q 9/0407* (2013.01)

(58) Field of Classification Search
CPC ........ H01Q 1/38; H01Q 9/0407; H01Q 1/243; H01Q 1/40; H01Q 1/44; H05K 1/09;
(Continued)

(56) References Cited

U.S. PATENT DOCUMENTS 9,837,707 B2 * 12/2017 Villarroel ................. H01Q 9/42
2009/0051620 A1 * 2/2009 Ishibashi ................ H01Q 1/243
343/897

(Continued)

FOREIGN PATENT DOCUMENTS

CN    105742787 A    7/1916
CN    101522408 A    9/2009
(Continued)

OTHER PUBLICATIONS

First Office Action from counterpart Chinese Patent Appln. No. 2018800134445 dated Feb. 21, 2020, and its English translation.

*Primary Examiner* — Vibol Tan
(74) *Attorney, Agent, or Firm* — DLA Piper LLP (US)

(57) ABSTRACT

The present invention relates to a transparent film antenna. The present invention comprises: an insulator film; and a metal electrode for an antenna, which is formed on the insulator film, wherein the transmittance of the metal electrode for an antenna is 80% to 95% inclusive. The present invention employs a metal electrode having a high transmittance and a low resistance, so as to provide a transparent film antenna which can be implemented in the screen display area of a display device, can be applied to a high frequency band for 3G to 5G mobile communication, can be implemented as a transparent film antenna satisfying a high transmittance, and can prevent moiré effects due to components of an antenna and thus improve the optical characteristics of a display device to which the antenna is coupled.

3 Claims, 2 Drawing Sheets

(51) Int. Cl.
*H01L 51/44* (2006.01)
*H01Q 1/24* (2006.01)

(58) Field of Classification Search
CPC .......... H05K 2201/0108; H01L 51/442; H01L 27/3225; Y02E 10/549
See application file for complete search history.

(56) References Cited

U.S. PATENT DOCUMENTS

| | | | |
|---|---|---|---|
| 2013/0021218 A1* | 1/2013 | Asanuma | H01Q 5/40 |
| | | | 343/810 |
| 2015/0115224 A1* | 4/2015 | Kou | H01L 51/5234 |
| | | | 257/40 |
| 2018/0224960 A1* | 8/2018 | Park | G06F 3/044 |

FOREIGN PATENT DOCUMENTS

| | | |
|---|---|---|
| JP | 2016-095502 A | 5/1916 |
| JP | 2010-500476 A | 1/2010 |
| KR | 2008-0002909 A | 1/2008 |
| KR | 2011-0077362 A | 7/2011 |
| KR | 2012/009186 A | 8/2012 |
| KR | 2015-0115024 A | 10/2015 |

* cited by examiner

TRANSPARENT FILM ANTENNA

TECHNICAL FIELD

This invention relates to a transparent film antenna, and more particularly, to a transparent film antenna that can be implemented in a screen display region of a display device by applying a metallic electrode with high transmittance and low resistance.

BACKGROUND ART

Recently, along with the large-scaling of a display provided in a communication device and thus the reduction of a bezel region, there has been a need to mount an antenna on a screen display region of a display.

However, when a conventional antenna is mounted on a screen display region of a display, the components of the antenna are unnecessarily visible to a user, and also the optical characteristics of a display device on which the antenna is mounted may be degraded due to a reduction in light transmittance.

With respect to such a display-integrated antenna, when a transparent antenna is manufactured using a metal oxide such as indium tin oxide (ITO) in order to improve visibility, it is difficult to satisfy electrical characteristics for driving the antenna due to the high resistance of a constituent material itself of the antenna. In particular, it is not possible to implement an antenna applicable to the next-generation high-frequency band such as 5G.

Also, when an antenna is manufactured using a metal such as Cu or Al in order to secure electrical characteristics, i.e., low resistance, the thickness of a metallic electrode has to be set to a predetermined value or higher in order to satisfy the electrical characteristics of the antenna. As a result, the light transmittance of a display device on which the antenna is mounted is reduced, and the optical characteristics of the display device on which the antenna is mounted are degraded because the components of the antenna are unnecessarily visible to a user.

PRIOR ART DOCUMENT

Patent Document (Patent Document 1) Korea Patent Publication No. 10-2015-0115024 (published on Oct. 14, 2015, entitled "Display information providing system using multi-NFC antenna and method thereof")

SUMMARY OF INVENTION

Technical Problem

A technical object of the present invention is to provide a transparent film antenna that can be implemented in a screen display region of a display device by applying a metallic electrode with high transmittance and low resistance.

Another technical object of the present invention is to provide a transparent film antenna that can be applied to high-frequency bands for 3G to 5G mobile communication, can be implemented by satisfying high transmittance, and can prevent the moiré phenomenon caused by the components of the antenna and thus improve the optical characteristics of a display device on which the antenna is mounted.

Solution to Problem

In order to achieve these technical objects, a transparent film antenna according to the present invention includes an insulator film and a metallic antenna electrode formed on the insulator film, wherein the metallic antenna electrode has a light transmittance ranging from 80% to 95%.

The transparent film antenna according to the present invention is characterized in that the metallic antenna electrode has a sheet resistance ranging from 0.05 Ω/sq to 2 Ω/sq.

The transparent film antenna according to the present invention is characterized in that the metallic antenna electrode contains Ag—Pd—Cu (APC) alloy.

The transparent film antenna according to the present invention is characterized in that the APC alloy has an Ag content ranging from 90% to 99%.

The transparent film antenna according to the present invention is characterized in that the metallic antenna electrode has a front metallic structure or a mesh structure.

The transparent film antenna according to the present invention is characterized in that the transparent film antenna has a transmission coefficient S21 of −5 dB or greater.

The transparent film antenna according to the present invention is characterized in that the transparent film antenna is formed in a screen region of a display device.

Advantageous Effects of Invention

According to the present invention, it is possible to provide a transparent film antenna that can be implemented in a screen display region of a display device by applying a metallic electrode with high transmittance and low resistance.

Also, it is possible to provide a transparent film antenna that can be applied to high-frequency bands for 3G to 5G mobile communication, can be implemented by satisfying high transmittance, and can prevent the moiré phenomenon caused by the components of the antenna and thus improve the optical characteristics of a display device on which the antenna is mounted.

DETAILED DESCRIPTION OF EMBODIMENT

Figure 1:
FIG. 1 is a diagram showing a transparent film antenna according to an embodiment of the present invention.

As specific structural or functional descriptions for the embodiments according to the concept of the invention disclosed herein are merely exemplified for purposes of describing the embodiments according to the concept of the invention, the embodiments according to the concept of the invention may be embodied in various forms and are not limited to the embodiments described herein.

While the embodiments of the present invention are susceptible to various modifications and alternative forms, specific embodiments thereof are shown by way of example in the drawings and will herein be described in detail. It should be understood, however, that there is no intent to limit the invention to the particular forms disclosed, but on the contrary, the invention is to cover all modifications, equivalents, and alternatives falling within the spirit and scope of the invention.

It will be understood that, although the terms "first," "second," etc. may be used herein to describe various elements, these elements should not be limited by these terms. These terms are only used to distinguish one element from another. For example, a first element could be termed a second element, and, similarly, a second element could be termed a first element, without departing from the scope of the present invention.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (i.e., "between" versus "directly between," "adjacent" versus "directly adjacent," etc.).

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, components, or groups thereof, but do not preclude the presence or addition of one or more other features, integers, steps, operations, elements, components, and/or groups thereof.

Unless otherwise defined, all terms (including technical or scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, preferred embodiments of the present invention will be described in detail with reference to the accompanying drawings.

FIG. 1 is a diagram showing a transparent film antenna according to an embodiment of the present invention.

Referring to FIG. 1, the transparent film antenna according to an embodiment of the present invention includes an insulator film 10 and a metallic antenna electrode 20.

According to an embodiment of the present invention, the transparent film antenna may be any antenna capable of being implemented in the form of a film. For example, the transparent film antenna according to an embodiment of the present invention may be a microstrip patch antenna. Advantageously, microstrip patch antennas are small in size, light in weight, easy to fabricate, uniform in signal radiation characteristics, and cheap in price. According to these advantages, the microstrip patch antennas are applied to various communication devices, and particularly, are suitable as antennas for 3G to 5G mobile communication. It will be appreciated that the transparent film antenna according to an embodiment of the present invention is not limited to the microstrip patch antennas.

As described when the problems of the related art have been described, along with the large-sizing of a display provided in a communication device and thus the reduction of a bezel region, there was a need to mount an antenna on a screen display region of a display. However, when the antenna is mounted on the screen display region of the display, the components of the antenna are unnecessarily visible to a user. Thus, the optical characteristics of a display device on which the antenna is mounted are degraded due to a reduction in light transmittance.

If a transparent antenna is manufactured using a metal oxide such as indium tin oxide (ITO) in order to improve visibility, it is difficult to satisfy electrical characteristics for driving the antenna due to the high resistance of a constituent material itself of the antenna. In particular, it is not possible to implement an antenna applicable to the next-generation high-frequency band such as 5G.

Also, when an antenna is manufactured using a metal such as Cu or Al in order to secure electrical characteristics, the thickness of a metallic electrode has to be set to a predetermined value or higher in order to satisfy the electrical characteristics of the antenna. As a result, the light transmittance of a display device on which the antenna is mounted is reduced, and the optical characteristics of the display device on which the antenna is mounted are degraded because the components of the antenna are unnecessarily visible to a user.

The transparent film antenna according to an embodiment of the present invention is to satisfy all performance requirements of such a display-integrated antenna. The transparent film antenna can be implemented in a screen display region of a display device by applying a metallic electrode with high transmittance and low resistance, can be applied to high-frequency bands for 3G to 5G mobile communication, can be implemented by satisfying high transmittance, and can prevent the moiré phenomenon caused by components of the antenna and thus improve the optical characteristics of the display device to which the antenna is coupled.

The insulator film 10 included in the transparent film antenna according to an embodiment of the present invention is an element that replaces a conventional printed circuit board. By applying a material having a transparent characteristic to the insulator film 10, it is possible to solve the problem of the elements of the antenna being unnecessarily visible.

The metallic antenna electrode 20 is formed on the insulator film 10 and configured to perform feeding, radiation, reception, grounding, and the like of signals. For example, when the transparent film antenna according to an embodiment of the present invention is a microstrip patch antenna, the metallic antenna electrode 20 may include a microstrip transmission line for signal feeding, a radiation patch for signal radiation and reception, and a ground for signal grounding.

In order to improve the optical characteristics of a display device on which the transparent film antenna according to an embodiment of the present invention is mounted, it is preferable that the light transmittance of the metallic antenna electrode 20 is set to 80% to 95% inclusive.

For example, in order for the transparent film antenna according to an embodiment of the present invention to have low resistance, it is preferable that the sheet resistance of the metallic antenna electrode 20 is set to 0.05 Ω/sq to 2 Ω/sq inclusive.

For example, in order for the display device on which the transparent film antenna according to an embodiment of the present invention is mounted to secure visibility and transmittance, the metallic antenna electrode 20 may have a front metal structure or a mesh structure.

For example, a transmission coefficient S21 of the transparent film antenna according to an embodiment of the present invention may be greater than or equal to −5 dB.

As a specific example, it is preferable that the metallic antenna electrode 20 contains Ag—Pd—Cu (APC) alloy and the content of Ag included in the APC alloy is 90% to 99% inclusive.

When the metallic antenna electrode 20 is configured as described above, an antenna with high transmittance and low resistance can be implemented in a screen display region of a display device, can be applied to high-frequency bands for 3G to 5G mobile communication, can be implemented as a transparent film antenna by satisfying high transmittance, and can prevent the moiré phenomenon caused by components of the antenna and thus improve the optical characteristics of the display device to which the antenna is coupled.

Figure 2:
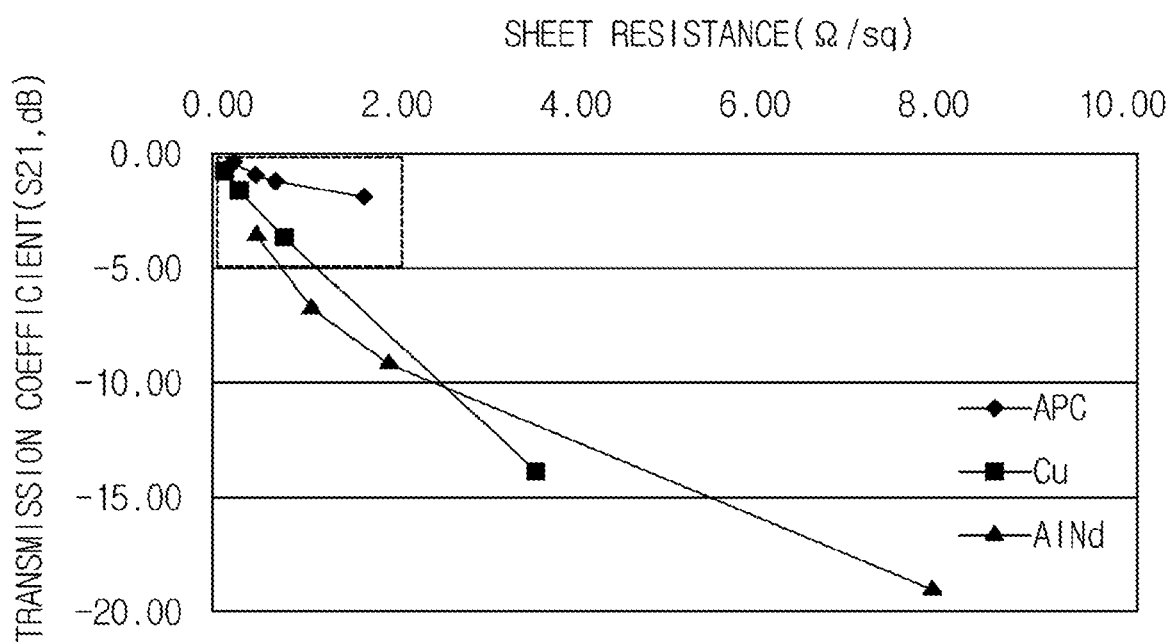
FIG. 2 is a graph showing sheet resistance and transmission coefficient characteristics corresponding to the thickness and material of a metallic antenna electrode according to an embodiment of the present invention.

Table 1 below shows the transmission coefficient S21 and the sheet resistance corresponding to the thickness and material of the metallic antenna electrode 20, and FIG. 2 is a graph showing the result.

That is, it can be seen that the signal transmission coefficient S21 of the antenna is enhanced along with an increase in the content of Ag included in the APC alloy. When an APC alloy containing 90% to 99% Ag is applied to the metallic antenna electrode 20, the transmission coefficient S21 is less than or equal to −5 dB, and thus the APC alloy can be applied to the antenna.

When a single metal Ag is applied to the metallic antenna electrode 20, there is a high risk of corrosion. Therefore, in order to maintain the durability and performance of the antenna, it is preferable to apply an APC alloy containing 90% to 99% Ag to the metallic antenna electrode 20 as in the embodiment of the present invention.

As described in detail above, according to the present invention, it is possible to provide a transparent film antenna capable of being implemented in a screen display region of a display device by applying a metallic electrode with high transmittance and low resistance.

Also, it is possible to provide a transparent film antenna that can be applied to high-frequency bands for 3G to 5G mobile communication, can be implemented by satisfying high transmittance, and can prevent the moiré phenomenon caused by the components of the antenna and thus improve the optical characteristics of a display device on which the antenna is mounted.

TABLE 1

| | APC | | Cu | | AlNd | |
|---|---|---|---|---|---|---|
| Thickness (Å) | Sheet Resistance (Ω/sq) | Transmission Coefficient (S21, dB) | Sheet Resistance (Ω/sq) | Transmission Coefficient (S21, dB) | Sheet Resistance (Ω/sq) | Transmission Coefficient (S21, dB) |
| 360 | 1.65 | −1.91 | 3.50 | −14.00 | 7.80 | −19.00 |
| 700 | 0.68 | −1.07 | 0.77 | −3.70 | 1.93 | −9.10 |
| 1000 | 0.51 | −0.86 | 0.32 | −1.50 | 1.10 | −6.50 |
| 2000 | 0.27 | −0.35 | 0.10 | −0.72 | 0.52 | −3.40 |

Referring to Table 1 and FIG. 2, the antenna characteristics according to the material of the metallic antenna electrode 20 are disclosed.

That is, APC has a lower sheet resistance in the same thickness than Cu and AlNd, and thus it can be seen that the signal transmission coefficient S21 of the antenna is good.

Also, it can be seen that better antenna characteristics, i.e., a better transmission coefficient S21 may be acquired when APC is applied to the metallic antenna electrode 20 than when Cu or AlNd is applied.

Figure 3:
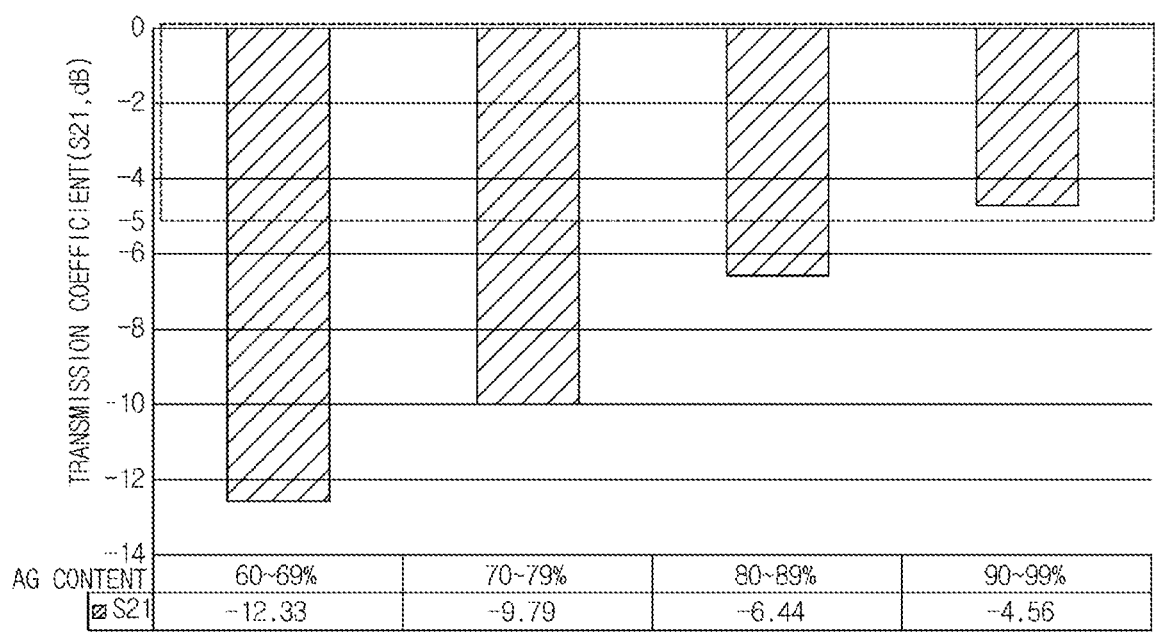
FIG. 3 is a graph showing transmission coefficient characteristics corresponding to the content of Ag included in Ag—Pd—Cu (APC) alloy, which is the material of the metallic antenna electrode according to an embodiment of the present invention.

Table 2 below shows the transmission coefficient S21 corresponding to the content of Ag included in the APC alloy, which is the material of the metallic antenna electrode 20, and FIG. 3 is a graph showing the result.

TABLE 2

| Content of Ag (%) | Transmission Coefficient S21 (dB) |
|---|---|
| 60-69 | −12.33 |
| 70-79 | −9.79 |
| 80-89 | −6.44 |
| 90-99 | −4.56 |

Referring to Table 2 and FIG. 3, the antenna characteristics according to the content of Ag included in the APC alloy are disclosed.

DESCRIPTION OF REFERENCE NUMERALS

10: Insulator film
20: Metallic antenna electrode

What is claimed is:

1. A transparent film antenna comprising:
an insulator film; and
a metallic antenna electrode formed on the insulator film,
wherein the metallic antenna electrode has a light transmittance ranging from 80% to 95%;
wherein the metallic antenna electrode has a sheet resistance ranging from 0.05 Ω/sq to 2 Ω/sq,
wherein the metallic antenna electrode contains APC alloy which has an Ag content ranging from 90% to 99%,
wherein the transparent film antenna is formed in a screen region of a display device and is applied to high-frequency bands for 3G to 5G mobile communication.

2. The transparent film antenna of claim 1, wherein the metallic antenna electrode has a front metal structure or a mesh structure.

3. The transparent film antenna of claim 1, wherein the transparent film antenna has a transmission coefficient S21 of −5 dB or greater.

* * * * *